United States Patent [19]
Su et al.

[11] Patent Number: 5,728,608
[45] Date of Patent: Mar. 17, 1998

[54] TAPERED DIELECTRIC ETCH IN SEMICONDUCTOR DEVICES

[75] Inventors: Yuh-Jia (Jim) Su, Cupertino; Yuen-Kui (Jerry) Wong, Fremont; Kam S. Law, Union City; Haruhiro (Harry) Goto, Saratoga, all of Calif.

[73] Assignee: Applied Komatsu Technology, Inc., Tokyo, Japan

[21] Appl. No.: 541,066

[22] Filed: Oct. 11, 1995

[51] Int. Cl.$^6$ .................................................. H01L 21/3065
[52] U.S. Cl. ........................ 438/149; 438/701; 438/713; 438/724; 438/978
[58] Field of Search ........................... 156/644.1, 646.1, 156/653.1, 657.1, 662.1; 216/23, 64, 79, 80; 437/21, 40 TFI, 40 TFT, 41 TFI, 41 TFT, 195, 981; 148/DIG. 51

[56] References Cited

U.S. PATENT DOCUMENTS

| | | | |
|---|---|---|---|
| 4,054,895 | 10/1977 | Ham | 437/41 TFT |
| 4,447,290 | 5/1984 | Matthews | 156/646.1 |
| 5,034,339 | 7/1991 | Tanaka et al. | 437/40 TFI |

FOREIGN PATENT DOCUMENTS

| | | | |
|---|---|---|---|
| 3714144 | 12/1987 | Germany | 156/646.1 |
| 62-293619 | 12/1987 | Japan. | |
| 4-261017 | 9/1992 | Japan. | |
| 5-226654 | 9/1993 | Japan. | |
| 6-196451 | 7/1994 | Japan. | |
| 61-248528 | 11/1996 | Japan. | |

OTHER PUBLICATIONS

Translation of JP 61-248528.
Translation of JP 5-226654.
Translation of DE 3,714,144.
K. Fujii et al., Jpn. J. Appl. Phys. 31(I/12B)(Dec. 1992)4574 "Process ... LCDs addressed by a-Si TFTs".
K. Tokashiki et al., Jpn. J. Appl. Phys. 30(I/11B)(Nov. 1991)3174 "Influence of halogen plasma atm. on SiO2 etching".
J. Pelletier et al., J. Vac. Sci. Technol. B7(1)(Jan. 1989)59 "Microwave plasma etching of Si and SiO2 in halogen ...".

Primary Examiner—Charles L. Bowers, Jr.
Assistant Examiner—Leon Radomsky
Attorney, Agent, or Firm—Fish & Richardson P.C.

[57] ABSTRACT

A method of etching openings in a dielectric layer of a semiconductor device by utilizing a novel etchant gas system of sulfur hexafluoride/chlorine such that sloped sidewalls can be formed in the openings having a desired taper of between about 20° and about 85° for achieving improved step coverage and profile control of the TFT fabrication process.

12 Claims, 2 Drawing Sheets

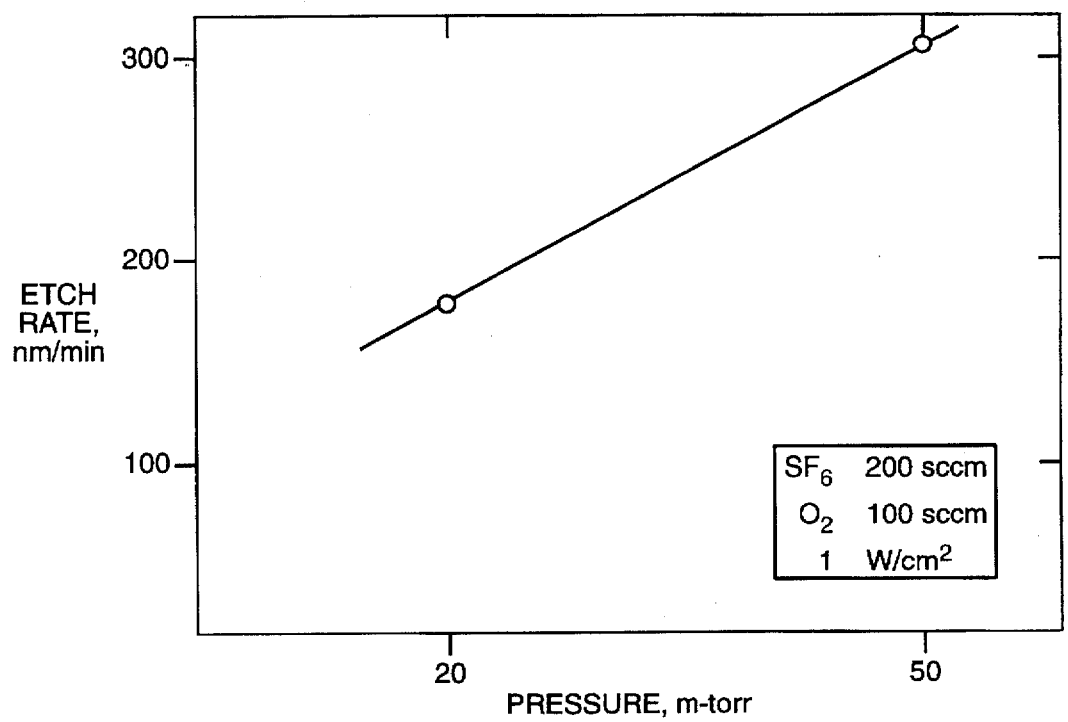
FIG._1A
*(PRIOR ART)*
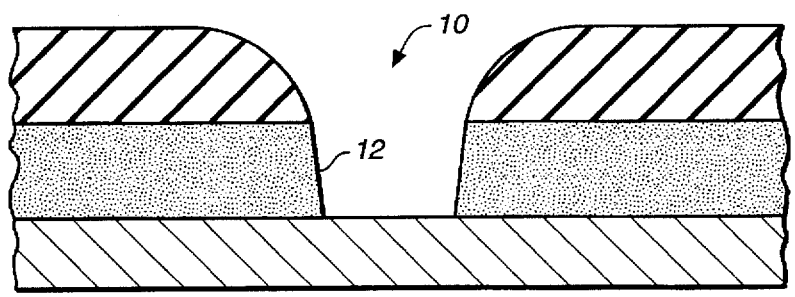
FIG._1B
*(PRIOR ART)*
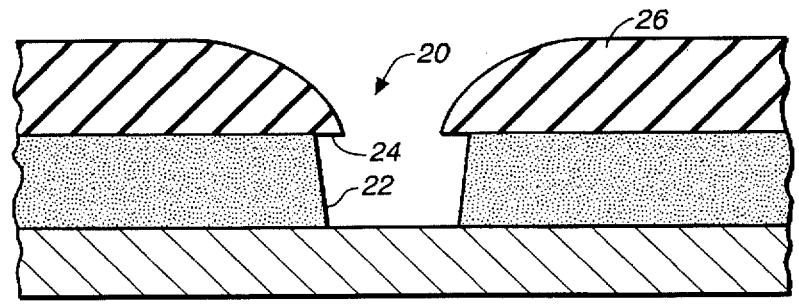
FIG._1C
*(PRIOR ART)*

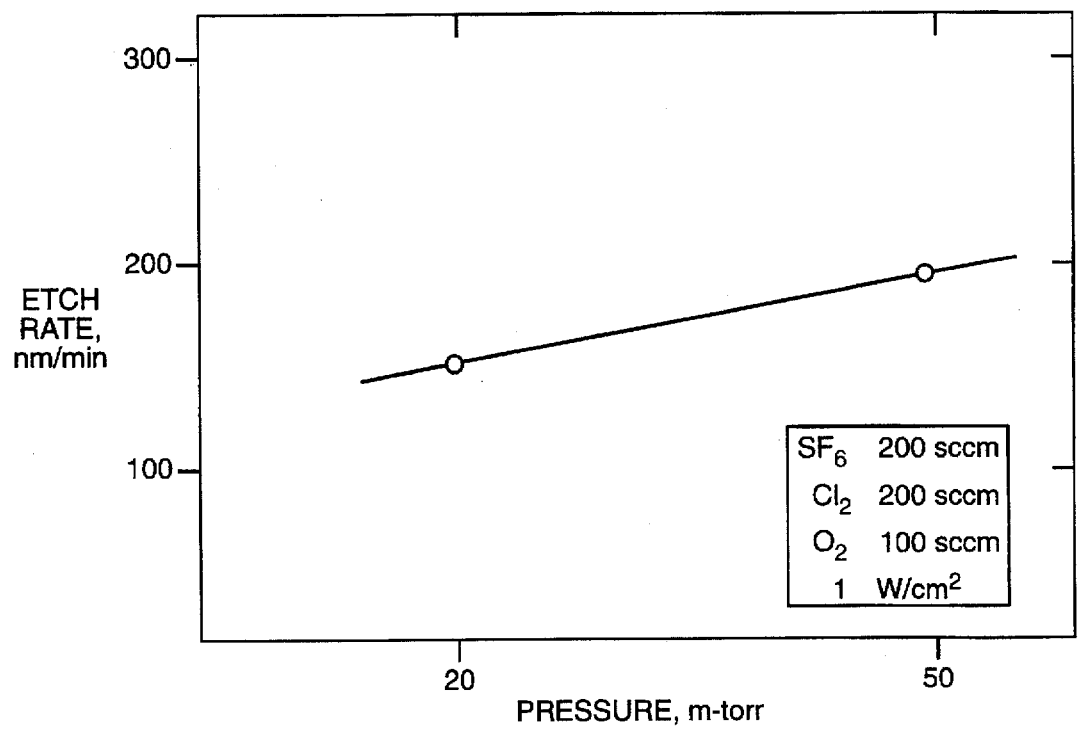
FIG._2A
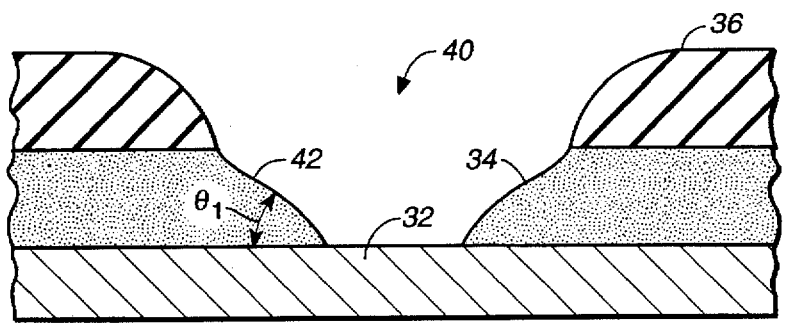
FIG._2B
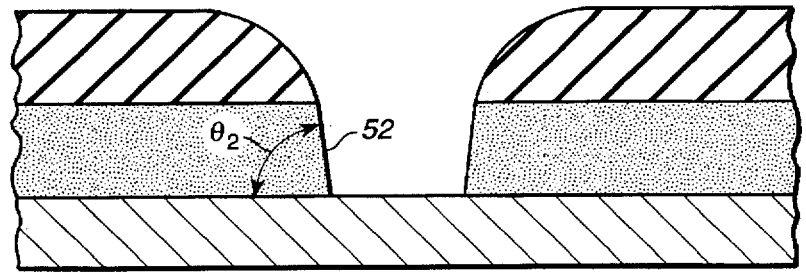
FIG._2C

5,728,608

TAPERED DIELECTRIC ETCH IN SEMICONDUCTOR DEVICES

FIELD OF THE INVENTION

The present invention generally relates to a method of etching a dielectric layer in a semiconductor device and more particularly, relates to a method of etching a dielectric layer in a semiconductor device by utilizing sulfur hexafluoride/chlorine chemistry such that tapered sidewalls in the opening of the dielectric layer can be formed and improved step coverage in subsequent deposition process can be achieved.

BACKGROUND OF THE INVENTION

Recently, thin film transistor (TFT) formed on the surface of an insulating substrate, such as glass or the like, has been widely used as a switching device in a matrix configuration to control a liquid crystal display device. The liquid crystal display device is used widely in televisions and computer monitors. In a liquid crystal display device, two glass plates are joined together with a layer of a liquid crystal material sandwiched thereinbetween. The glass plates have conductive films coated on their surfaces where at least one of the substrates is transparent. The substrates are connected to a power source to change the orientation of the liquid crystal material so that various areas of the liquid crystal display cell can be accessed by proper patterning of the conductive film. The thin film transistors are used to separately address areas of the liquid crystal cells at very fast rates. As the requirements for the resolution of liquid crystal monitors increase, it becomes desirable to separately address a plurality of areas of the liquid crystal cell, called pixels. In a modern display panel, more than 1,000,000 pixels are normally present and the same number of thin film transistors must be formed on the glass plates so that each pixel can be separately addressed and latched into one of two stable states.

One of the major types of thin film transistor devices used today is a back channel etched (BCE) thin film transistor. A BCE type thin film transistor is fabricated by first forming a gate conductor on an upper surface of an insulating substrate, a gate dielectric layer of silicon nitride or silicon oxide is then deposited over the gate conductor. A substantially hydrogenated intrinsic amorphous silicon is then deposited over a hydrogen plasma treated silicon nitride layer and a layer of N+ doped amorphous silicon is subsequently deposited over the amorphous silicon layer. Thereafter, a layer of source/drain metalization is deposited over the N+ doped silicon layer and subsequently patterned to form respective source and drain electrodes. Plasma enhanced chemical vapor deposition (PECVD) process is commonly used for depositing materials in the fabrication of TFTs.

In a fabrication process for TFTs, numerous dielectric material layers are deposited. The dielectric materials employed include silicon nitride, silicon oxide, and any other suitable dielectric materials. The dielectric materials are used for insulative purpose such as in a gate dielectric layer or in a passivation layer. When electrical contacts must be made through a dielectric layer, the layer is etched by first applying a photomask to the layer to pattern openings for the contacts. The contact openings are then etched by a suitable etchant gas and filled in a subsequent metal deposition process. In a conventional-TFT fabrication process, a step coverage problem is frequently encountered in the etching and the subsequent metal deposition process.

For instance, a conventional etching process for a silicon nitride layer by using $SF_6/O_2$ chemistry is shown in FIGS. 1A through 1C. The etch rates of a silicon nitride film by $SF_6/O_2$ gas at 20 m-torr and 50 m-torr are shown in FIG. 1A. It is seen that at a chamber pressure of 20 m-torr, an etch rate of approximately 200 nm/min is obtained. At a higher chamber pressure of 50 m-torr, an etch rate of approximately 300 nm/min is obtained. An enlarged cross-sectional view of a semiconductor device 10 etched at 20 m-torr is shown in FIG. 1B. A vertical sidewall in the silicon nitride opening is obtained by the $SF_6/O_2$ gas etching. An enlarged cross-sectional view of a semiconductor device 20 after etching by the same etchant gas at 50 m-torr is shown in FIG. 1C. A vertical sidewall 22 in the silicon nitride layer is obtained which shows a small undercut 24.

The etching of silicon nitride by $SF_6/O_2$ presents a profile control problem which leads to poor step coverage in the subsequent metal deposition process. The step coverage problem occurs when the sharp corners in the opening created by the vertical sidewalls are not covered by the subsequently deposited metal and as a result, voids at the corners are formed. The voids increase the resistance of the metal conductor and decrease the efficiency of the device. The formation of vertical sidewalls in nitride openings therefore should be avoided.

It is therefore an object of the present invention to provide a method of etching a dielectric layer in a semiconductor device that does not have the drawbacks or shortcomings of the prior art methods.

It is another object of the present invention to provide a method for etching a dielectric layer in a semiconductor device that is capable of providing improved profile control.

It is a further object of the present invention to provide a method of etching holes or trenches in a dielectric layer of a semiconductor device and then filling the holes or trenches without a step coverage problem.

It is yet another object of the present invention to provide a method of etching openings of holes or trenches in a dielectric layer of a semiconductor device without the formation of vertical sidewalls in the etched openings.

It is still another object of the present invention to provide a method of etching openings in a dielectric layer of a semiconductor device by using an etchant gas mixture of $SF_6/Cl_2$.

It is another further object of the present invention to provide a method of etching openings in a dielectric layer of a semiconductor device that is capable of producing sloped sidewalls in the openings.

It is still another further object of the present invention to provide a method of etching openings in a dielectric layer of a semiconductor device capable of producing sloped sidewalls having a taper between about 20° and about 85° in the openings.

It is yet another further object of the present invention to provide a method of etching openings in a dielectric layer of a semiconductor device that is capable of producing sloped sidewalls in the openings such that possible void formation in a subsequent deposition process can be avoided.

SUMMARY OF THE INVENTION

In accordance with the present invention, a method of etching openings in a dielectric layer in a semiconductor device that is capable of producing sloped sidewalls in the openings of the dielectric layer is provided.

In the preferred embodiment, a method of etching a silicon nitride dielectric layer is carried out by using an etchant gas system of sulfur hexafluoride/chlorine. The chlorine gas etches away the edge portion of the photoresist layer deposited on top of the silicon nitride to expose a larger area of the nitride so that sulfur hexafluoride attacks the nitride to form sloped sidewalls. The taper of the sloped sidewalls can be controlled in a range of between about 20° and about 85° by changing the ratio of the gas mixture. A preferred range of the taper is between about 35° and about 70°. Optionally, oxygen may be used as a third component in the gas mixture to further facilitate the etching process. It is believed that oxygen accelerates the etching processes of both the photoresist layer and the silicon nitride layer. The sloped sidewalls facilitate a subsequent deposition process of a metal contact layer.

The present invention etching method affords improved profile control during a semiconductor fabrication process and substantially eliminates the step coverage problem. Void formation in a contact opening after metal deposition can be avoided and the overall performance of the device can be improved.

The present invention is further directed to a semiconductor device that is fabricated from a substrate that has a dielectric layer deposited thereon and openings with sloped sidewalls etched in the dielectric layer. The device has improved quality and performance since metal contacts formed in the openings do not have the step coverage problem normally encountered in a conventional method.

BRIEF DESCRIPTION OF THE DRAWINGS

Other objects, features and advantages of the present invention will become apparent upon consideration of the specification and the appended drawings, in which:

FIG. 1A is a graph illustrating the etch rate dependence of the silicon nitride etching process on the $SF_6/O_2$ gas pressure.

FIG. 1B is an enlarged cross-sectional view of a semiconductor substrate etched at 20 m-torr chamber pressure by $SF_6/O_2$.

FIG. 1C is an enlarged cross-sectional view of a semiconductor substrate etched by $SF_6/O_2$ at a chamber pressure of 50 m-torr.

FIG. 2A is a graph illustrating the etch rate dependence of silicon nitride on the $SF_6/Cl_2/O_2$ gas pressure.

FIG. 2B is an enlarged cross-sectional view of a semiconductor substrate etched by $SF_6/Cl_2/O_2$ at a chamber pressure of 20 m-torr.

FIG. 2C is an enlarged cross-sectional view of a semiconductor substrate etched by $SF_6/Cl_2/O_2$ at a chamber pressure of 50 m-torr.

DETAILED DESCRIPTION OF THE PREFERRED EMBODIMENT

The present invention method of etching openings in a dielectric layer of a semiconductor device utilizes a unique etchant gas mixture of sulfur hexafluoride/chlorine for achieving improved step coverage and profile control in the fabrication process of a semiconductor device.

In an inverted, trilayer TFT structure, a thin film dielectric material such as silicon nitride or silicon oxide is frequently used for the gate dielectric layer and the channel passivation layer. A plasma enhanced chemical vapor deposition technique is used to deposit the silicon nitride or the silicon oxide layer. In the example shown in the present invention, the etching of a silicon nitride film is illustrated. However, the present invention novel method of etching sloped openings in a dielectric layer can be equally applied to silicon oxide or any other suitable dielectric materials.

Referring initially to FIG. 2A, wherein the etch rate dependence of silicon nitride on the chamber pressure when etched by a gas mixture of $SF_6/Cl_2/O_2$ is illustrated. A laboratory test sample is prepared by first providing a substrate made of a glass material such as Corning 7059 containing 49% $SiO_2$, 10% $Al_2O_3$, 15% $B_2O_3$, 25% BaO and 1% $As_2O_5$. In an etchant gas mixture of $SF_6/Cl_2/O_2$, the etch rate by the same gas mixture on the glass at 20 m-torr chamber pressure is approximately 100 nm/min. It is not significantly lower than the etch rate on silicon nitride, i.e. approximately 150 nm/min at 20 m-torr. The glass substrate is therefore not an effective etch stop for the nitride layer. However, the etching of nitride can be effectively controlled by an optical emission end point technique wherein the ion emission at the etch surface is monitored so that the etching process can be stopped when the nitride layer is completely etched away.

As shown in FIG. 2B, a silicon nitride layer 34 of approximately 200 nm thick is first deposited on a glass substrate 32. A suitable thickness is in the range of between about 100 nm and about 300 nm. A photoresist 36 of approximately 1200 nm thick is then deposited and patterned on the nitride layer 34. An opening 40 of either a hole or a trench is etched into the nitride layer 34.

The etching of the nitride layer is conducted by an reactive ion etching technique performed at a predetermined radio frequency utilizing the special etchant gas system. In the example shown in FIG. 2B, the etchant gas is fed into the reaction chamber at a flow rate of 200 sccm of $SF_6$, 200 sccm $Cl_2$ and 100 sccm $O_2$. A minimum chamber pressure of 5 m-torr of the etchant gas should be used, while chamber pressure as high as 100 m-torr can be used.

As shown in FIG. 2B, at 20 m-torr chamber pressure, an opening 40 having sloped sidewalls 42 with a taper $\theta_1$ of approximately 45° is obtained. The taper of the sidewall is measured from the top surface of the glass substrate 32. In a TFT fabrication process, due to the large surface area of the substrate, a minimum flow rate of the etchant gas must be maintained in order to achieve an acceptable etch rate. For instance, for a typical TFT substrate of 36 cm×46.5 cm, a flow rate of 200 sccm $SF_6$, 200 sccm $Cl_2$, and 100 sccm $O_2$ is required. A carrier gas of argon or helium, either along or in mixtures thereof, may optionally be added to the etchant gas system.

In the example given above, the flow rate ratio of $Cl_2$ and $SF_6$ in the etchant gas is 1. It has been discovered that the flow rate ratio of $Cl_2/SF_6$ can be any value between about 0.5 and about 1.5. The presence of oxygen is optional which provides the additional benefit of increasing the etch rate of $SF_6$ and $Cl_2$. The power density used for the plasma source is about 1 $W/cm^2$, even though a range of the power density can be used is between about 0.4 $W/cm^2$ and about 2 $W/cm^2$. The presence of oxygen is generally believed not contributing to the profile of the sidewall formed.

It is believed that in the etchant gas system, $SF_6$ is responsible for the removal of nitride while $Cl_2$ is responsible for the removal of the photoresist. Oxygen enhances both the photoresist and the nitride removal.

It should be noted that in the example of FIGS. 2A–2C, silicon nitride is deposited on a glass substrate for illustration purpose. In a fabrication process for TFT, silicon nitride or any other dielectric material can be deposited over other semiconducting or conducting material layers. For instance, silicon nitride is commonly used in TFT fabrication as a gate dielectric layer or as a channel passivation layer.

The enlarged cross-sectional view of a silicon nitride layer etched at a higher chamber pressure, i.e. 50 m-torr is shown in FIG. 2C. It is seen that a desirable, sloped sidewall 52 is formed in the process. The slope achieved is greater than that achieved at a chamber pressure of 20 m-torr, i.e. a taper $\theta_2$ of approximately 60°. It has been discovered that by adjusting the flow rate ratio of $Cl_2/SF_6$, the taper of the sloped sidewalls in the nitride layer can be suitably adjusted. To achieve maximum step coverage and improved profile control in a fabrication process, a taper of the sidewall between about 20° and about 85° is desirable. A more preferred range of the taper is between about 35° and about 70°. It should be noted that any taper of the sidewall should contribute to a reduction of void formation in the openings, even though the maximum effect is achieved in the above stated ranges of taper.

After openings for holes or trenches are formed by the etching of the nitride layer, a conductive material is deposited into the openings. A commonly used conductive material in TFT fabrication is indium-tin-oxide (ITO). However, other conductive metals such as aluminum, tantalum, molybdenum or any other suitable metals can also be used to form contacts.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A method for processing a semiconductor device comprising:

providing a substrate of an insulative material, said substrate having a top surface, depositing a layer of a dielectric material on the top surface of said substrate, depositing and patterning a layer of a photoresist on top of said dielectric material, and applying $SF_6$ gas and $Cl_2$ gas to said dielectric material layer and said patterned photoresist layer to remove at least a portion of said dielectric material layer and thereby form at least one opening in said dielectric material layer that extends to the top surface of said substrate, said opening having substantially sloped sidewalls extending between said dielectric material layer and the top surface of said substrate.

2. A method according to claim 1, wherein said $SF_6$ gas and said $Cl_2$ gas are introduced into a chamber containing said substrate at a pressure between about 5 m-torr and about 100 m-torr.

3. A method according to claim 1, wherein said $SF_6$ gas and said $Cl_2$ gas are introduced into a chamber containing said substrate at a flow rate ratio for $Cl_2:SF_6$ of between about 0.5 and about 1.5.

4. A method according to claim 1, wherein $O_2$ gas is applied to said dielectric material layer and said patterned photoresist layer in combination with said $SF_6$ gas and said $Cl_2$ gas.

5. A method according to claim 1, wherein said substantially sloped sidewalls are formed in both the photoresist layer and the dielectric layer.

6. A method according to claim 1, wherein said dielectric material is silicon nitride or silicon oxide.

7. A method according to claim 1, wherein said sloped sidewalls formed in said opening have a taper of between about 20° and about 85°.

8. A method according to claim 1, wherein said sloped sidewalls formed in said opening have a taper of between about 35° and about 70°.

9. A method according to claim 1 further comprising the step of depositing a conductive material in said at least one opening formed in said dielectric material layer.

10. A method according to claim 9, wherein said conductive material is selected from the group consisting of indium-tin-oxide, aluminum, tantalum and molybdenum.

11. A method according to claim 1, wherein said semiconductor device is a thin film transistor.

12. A method according to claim 1, wherein said substrate of an insulative material is a glass substrate.

* * * * *